(12) United States Patent
Mech et al.

(10) Patent No.: US 7,190,051 B2
(45) Date of Patent: Mar. 13, 2007

(54) CHIP LEVEL HERMETIC AND BIOCOMPATIBLE ELECTRONICS PACKAGE USING SOI WAFERS

(75) Inventors: Brian V. Mech, Stevenson Ranch, CA (US); Robert J. Greenberg, Los Angeles, CA (US); Gregory J. DelMain, Maple Grove, MN (US)

(73) Assignee: Second Sight Medical Products, Inc., Sylmar, CA (US)

( * ) Notice: Subject to any disclaimer, the term of this patent is extended or adjusted under 35 U.S.C. 154(b) by 0 days.

(21) Appl. No.: 10/360,988

(22) Filed: Feb. 7, 2003

(65) Prior Publication Data

US 2004/0155290 A1    Aug. 12, 2004

Related U.S. Application Data

(60) Provisional application No. 60/440,806, filed on Jan. 17, 2003.

(51) Int. Cl.
*H01L 23/58* (2006.01)
(52) U.S. Cl. ............... 257/632; 257/647; 257/E23.192
(58) Field of Classification Search .............. 257/632, 257/647, E23.192
See application file for complete search history.

(56) References Cited

U.S. PATENT DOCUMENTS

| | | | |
|---|---|---|---|
| 5,109,844 A | 5/1992 | de Juan, Jr. et al. | |
| 5,750,926 A * | 5/1998 | Schulman et al. | 174/52.3 |
| 5,935,155 A | 8/1999 | Humayun et al. | |
| 6,362,070 B1 | 3/2002 | Villa et al. | |
| 6,461,939 B1 | 10/2002 | Furihata et al. | |
| 6,465,316 B2 | 10/2002 | Hattori et al. | |
| 6,492,683 B2 | 12/2002 | Kobayashi | |
| 6,503,799 B2 | 1/2003 | Horita et al. | |
| 6,516,808 B2 * | 2/2003 | Schulman | 128/899 |
| 6,995,049 B2 * | 2/2006 | Takahashi | 438/149 |
| 7,053,451 B2 * | 5/2006 | Maeda et al. | 257/347 |
| 2002/0120296 A1 * | 8/2002 | Mech et al. | 607/2 |
| 2003/0078643 A1 * | 4/2003 | Schulman et al. | 607/116 |
| 2004/0135473 A1 * | 7/2004 | Byers et al. | 310/348 |

\* cited by examiner

*Primary Examiner*—Ngân V. Ngô
(74) *Attorney, Agent, or Firm*—Gary Schnittgrund; Scott B. Dunbar; Tomas Lendvai

(57) ABSTRACT

The invention is directed to a hermetically packaged and implantable integrated circuit for electronics that is made by producing streets in silicon-on-insulator chips that are subsequently coated with a selected electrically insulating thin film prior to completing the dicing process to yield an individual chip. A thin-layered circuit may transmit light, allowing a photodetector to respond to transmitted light to stimulate a retina, for example. Discrete electronic components may be placed in the three-dimensional street area of the integrated circuit package, yielding a completely integrated hermetic package that is implantable in living tissue.

18 Claims, 2 Drawing Sheets

CHIP LEVEL HERMETIC AND BIOCOMPATIBLE ELECTRONICS PACKAGE USING SOI WAFERS

CROSS REFERENCE TO RELATED APPLICATION

This application claims the benefit of U.S. Provisional Application No. 60/440,806, "Chip Level Hermetic and Biocompatible Electronics Package Using SQI Wafers", filed Jan. 17, 2003 the disclosure of which is incorporated herein by reference.

FIELD OF THE INVENTION

This invention relates to a hermetic integrated circuit and a method of making an integrated electronic circuit by utilizing silicon-on-insulator (SOI) techniques.

BACKGROUND OF THE INVENTION

This invention relates to electrically insulating thin film processes that are hermetic and that are used to encapsulate integrated circuits (ICs) for the purpose of forming a protective package for an electronic circuit, where the ICs are applicable to devices that are implanted in living tissue, such as neural prostheses or retinal electrode arrays. The package may have electrical feedthroughs to connect electrically to the outside environment. The electric circuit may interface with the outside environment optically (for example, infrared or laser) or via electromagnetic means, such as radio frequency (RF) and thus it may not need an exposed feedthrough. Additionally, the hermetic film may be made selectively electrically conductive in certain regions to facilitate signal transmission or power transmission.

The main drawback to thin film packaging of electronic circuits that are implanted in living tissue is that the process is typically three-dimensional since the entire IC needs to be packaged (encapsulated in a thin film). This results in long deposition times that add cost and that could exceed the thermal budget of the electronic circuits, thereby destroying the device. The invention describes a device and means for reducing the required deposition process time by allowing an equivalent package to be constructed in a two-dimensional deposition that covers several chips at the same time at the wafer level.

SUMMARY OF THE INVENTION

In accordance with a preferred embodiment of this invention, the apparatus of the instant invention is a hermetic and biocompatible electronics package that is made by applying silicon-on-insulator (SOI) technology and thin film deposition technology to enable large-scale production of individual integrated circuits for electronic packages that may be implantable in living tissue.

The SOI wafer is diced partially through its thickness. The spaces between the chips, die, or reticules are scored or semi-diced by one of several known means, in order to produce three-dimensional streets. The depth of these three-dimensional streets passes completely through the silicon layer and partially through the insulating layer. The three-dimensional streets are then coated along with the silicon layer to yield a hermetic electronics package that is suitable for implantation in living tissue.

In accordance with an alternative embodiment, the thin silicon layer may be transparent to light, thus allowing light to strike a photodetector on the surface away from the light source. This may have application in neural prostheses or retinal electrode arrays, for example, where light passes through the integrated circuit, strikes a photodetector, which in turn stimulates the retina to enable vision in a non-functioning eye. In this case, it passes through the insulator then through the silicon/integrated circuit layer.

A further embodiment places discrete electronic circuit components in the street area of the integrated circuit. The discrete component is then coated and thus part of the hermetically sealed, implantable electronics package.

The novel features of the invention are set forth with particularity in the appended claims. The invention will be best understood from the following description when read in conjunction with the accompanying drawings.

OBJECTS OF THE INVENTION

It is an object of the invention to produce a hermetically sealed integrated circuit using silicon-on-insulator technology and thin film deposition technology.

It is an object of the invention to produce a light transparent thin-layered integrated circuit chip using silicon-on-insulator techniques.

It is an object of the invention to produce a discrete integrated circuit that has discrete electronic components hermetically protected wherein select components are located in the street area of the integrated circuit.

Other objects, advantages and novel features of the present invention will become apparent from the following detailed description of the invention when considered in conjunction with the accompanying drawing.

DETAILED DESCRIPTION OF THE PREFERRED EMBODIMENT

Starting with a base substrate wafer facilitates reducing process time. A silicon-on-insulator (SOI) wafer is used as the starting substrate as opposed to a standard silicon wafer. The invention is not limited to a silicon wafer, and it is envisioned that alternative semiconductors may be employed, such as gallium arsenide. In the case, where the integrated circuit (IC) is suitable for implantation in living tissue, a silicon-on-sapphire (SOS) or a silicon-on-diamond (SOD) wafer forms alternate embodiments, because the insulating layer is both biocompatible and bio-inert. A preferred embodiment is to the broader class of SOI wafers for electronic circuits for forming ICs for electronic circuits.

Figure 1:
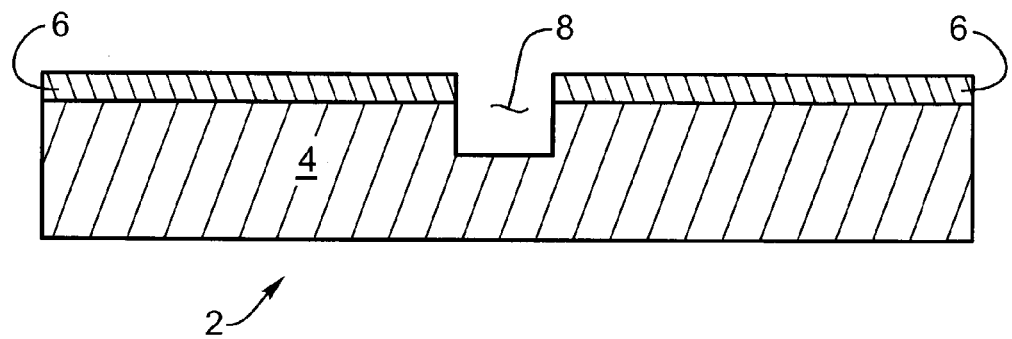
FIG. 1 illustrates a cross sectional side view of the silicon-on-insulator chip assembly.

Using these wafers, the circuitry is designed using an electronics process that is known to one skilled in the art (e.g., 0.5 um CMOS) and this process is conducted to produce a wafer of functional die, such as ICs or chips). Typically, such wafers are post-processed, such as being thinned and polished, then diced into individual chips that are placed into their own packages. In a preferred embodiment, a wafer 2 is diced part of the way through, such that the spaces between the chips, die, or reticules are semi-diced by one of several known means in order to produce a three-dimensional street 8 having a depth that passes completely through a silicon layer 6 and partially through an insulator substrate 4, as shown in FIG. 1.

The insulator substrate 4 is preferably comprised of silica, although in alternative embodiments it may be comprised of glass or oxide materials that are electrical insulators. For implantation in living tissue, the insulator substrate 4 is preferably selected from a group of materials that are biocompatible and bio-inert, such as sapphire, diamond, silica, or oxide ceramics.

The main advantage of such a technique is that it eliminates the need to cover the back of the ICs with an electrically insulating and hermetic thin film, while permitting a single coating deposition process at the wafer level. The wafer level deposition of the insulating thin film 10 covers the sides of the three-dimensional street 8, eliminating the need for any further deposition coatings. Choices for the deposition process for the insulating thin film 10 and material selection are known in the art. Candidate materials include diamond, such as ultra-nanocrystalline diamond (UNCD) or ceramics, such as alumina.

Figure 2:
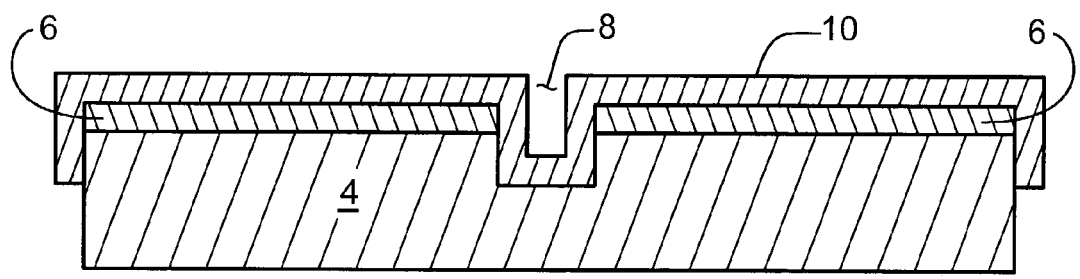
FIG. 2 depicts a cross sectional side view of the silicon-on-insulator chip assembly showing the insulating thin film.

The thin film process is preferably a physical vapor deposition such as Ion Beam Assisted Deposition (IBAD), which like physical vapor deposition processes, is line-of-sight deposition, it none the less is capable of uniformly covering high aspect ratio features. In an alternative embodiment, a CVD process (which is not line of sight), such as microwave plasma chemical vapor deposition (MPCVD), is selected because it is also well suited to this requirement as it naturally fills in regions such as the three-dimensional street 8. After a blanket deposition of the insulating thin film 10 over the entire wafer (which may be accomplished in several layers) the resulting structure appears as presented in FIG. 2.

Figure 4:
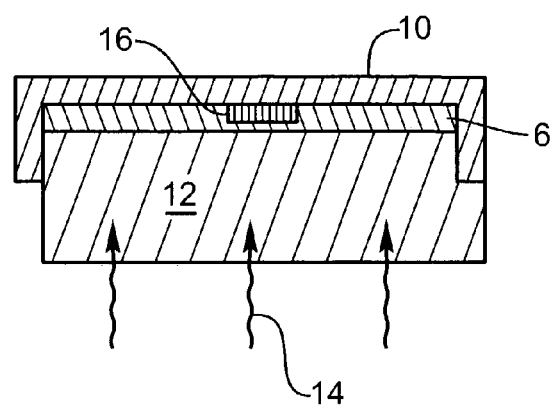
FIG. 4 illustrates a cross-sectional side view of a light transparent insulator with a photoelectric cell.

A further alternative embodiment utilizes an IC package that is at least partially transparent to light 14, as illustrated in FIG. 4, where the light 14 is preferably visible light. In alternative embodiments, the light 14 may include other types of electromagnetic radiation that is detectable with a sensor that is specific to the transmitted radiation. By using an SOI device, the insulator 12 may be chosen to have favorable transmission properties for electromagnetic radiation 14. A preferred embodiment has a photoelectric cell 16, which includes, but is not limited to, photo detectors, cadmium sulfide crystals, light sensors, phototransistors, or photodiodes that are located on a surface away from the light source.

In alternative embodiments, the photoelectric cell 16 may be any electronic circuit that responds to exposure to electromagnetic radiation 14 by generating an electric impulse. In FIG. 4, the photoelectric cell 16 is located in the silicon layer 6 and is separated from the transparent insulator 12 by a portion of the silicon layer 6. The invention is not limited to silicon layer 6 and it is envisioned that alternative semiconductor materials may be employed, such as gallium arsenide. In alternative embodiments, the photoelectric cell 16 is in direct contact with transparent insulator 12. The photoelectric cell 16 may be located on the surface of the insulator 12, in an alternative embodiment.

A preferred application is a device such as a neural prosthesis where the prosthesis may alternately be a retinal electrode array or demultiplexer, wherein the transmitted light 14 stimulates a photoelectric cell 16, which in turn stimulates the retina, enabling a non-functioning eye to detect and see visible light. Alternative embodiments enable other types of electromagnetic radiation 14, such as infrared or ultraviolet radiation, to be detected after the radiation passes through the transparent insulator 4.

Figure 5:
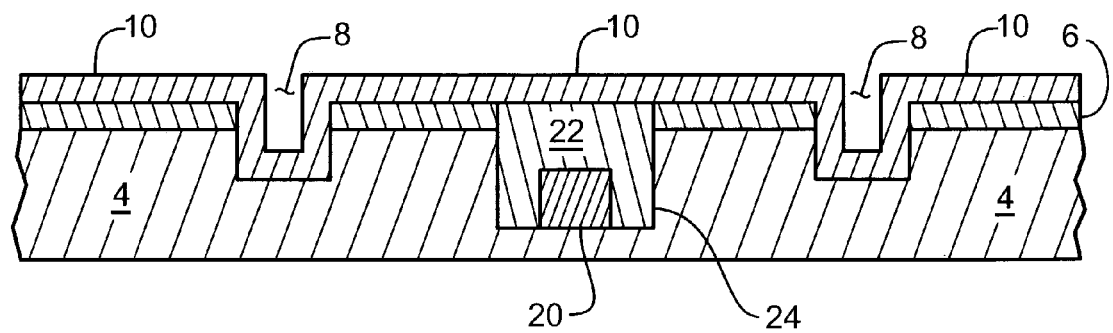
FIG. 5 depicts a hermetically coated silicon-on-insulator IC with a discrete component.

In yet another embodiment, FIG. 5, a discrete electronic component 20 is placed in a hole 24 that passes part of the way through the thickness of insulator substrate 4. The hole 24 is formed by any of the techniques that are know in the art, such as reactive ion etching, laser ablation, wet etching, dry etching, or combinations of these techniques. The hole 24 is filled with an electrically insulating fill 22, preferably epoxy. After final dicing into a packaged chip, the discrete component 20 is hermetically protected in the three-dimensional street 8 of the hermetically packaged and implantable IC, having been covered with the electrically insulating thin film 10. In a preferred embodiment, the discrete component 20 is a capacitor, although in alternative embodiments the discrete component 20 may be a resistor, filter, inductor, or a combination of these electronic circuitry elements.

The advantages of this packaging approach for an implantable IC chip is that all electronic circuitry is in a single package with internal electrical leads that are hermetically sealed in the package, thereby eliminating the need for external connections and feedthroughs, which are notoriously difficult to hermetically seal for long-term living tissue implant applications.

Figure 3:
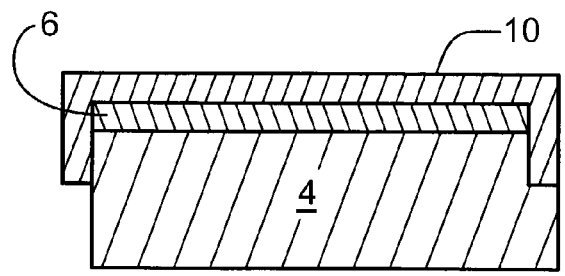
FIG. 3 depicts a cross sectional side view of a single silicon-on-insulator chip.

The chips can be singulated completely by a second dicing cut in the previously formed three-dimensional street 8 using known techniques, such as laser cutting, standard dicing, or a similar procedure. The resulting packaged chip is depicted in FIG. 3.

Using the disclosed techniques, a wafer that contains numerous discrete chips, perhaps hundreds of discrete chips, is packaged in a fraction of the time that it previously took to package just one chip.

Obviously, many modifications and variations of the present invention are possible in light of the above teachings. It is therefore to be understood that, within the scope of the appended claims, the invention may be practiced otherwise than as specifically described.

What is claimed is:

1. An electronics package suitable for implantation in living tissue comprising:
   a silicon-on-insulator chip assembly comprising a silicon layer on top of an insulator substrate and said silicon layer bonded to said insulator substrate; and
   a hermetic electrically insulating thin film covering the top and the sides of said silicon layer and extending the sides of said insulator substrate to a partial thickness of said insulator substrate.

2. The electronics package according to claim 1 wherein said silicon layer comprises an integrated circuit.

3. The electronics package according to claim 1 wherein said insulator substrate has an exposed area of said insulator substrate that is covered by said hermetic electrically insulating thin film.

4. The electronics package according to claim 1 wherein said hermetic electrically insulating thin film is comprised of alumina.

5. The electronics package according to claim 1 wherein said hermetic electrically insulating thin film is comprised of diamond.

6. The electronics package according to claim 1 wherein said hermetic electrically insulating thin film is biocompatible.

7. The electronics package according to claim 1 wherein said insulator substrate is biocompatible.

8. The electronics package according to claim 1 wherein at least one discrete electronic component is bonded to said insulator substrate and is covered by said hermetic electrically insulating thin film.

9. The electronics package according to claim 8 wherein said at least one discrete electronic component is further comprised of a capacitor.

10. The electronics package according to claim 8 wherein said at least one discrete electronic component is embedded.

11. An electronics package suitable for implantation in living tissue comprising:
- a silicon-on-insulator chip assembly comprising a silicon layer on top of an insulator substrate and said silicon layer bonded to said insulator substrate;
- a hermetic electrically insulating thin film covering the top and the sides of said silicon layer and extending the sides of said insulator substrate to a partial thickness of said insulator substrate; and
- wherein said insulator substrate is transparent to light.

12. The electronics package according to claim 11 wherein said silicon layer contains at least one photoelectric cell that produces an electric impulse when stimulated by electromagnetic radiation.

13. The electronics package according to claim 11 wherein said silicon layer contains at least one photoelectric cell that produces an electric impulse when stimulated by light.

14. The electronics package according to claim 11 wherein said insulator substrate is glass.

15. The electronics package according to claim 11 wherein said insulator substrate is sapphire.

16. The electronics package according to claim 11 wherein said electronics package comprises a neural prosthesis.

17. The electronics package according to claim 7 wherein said insulator substrate is sapphire, diamond, silica, or at least one oxide ceramic.

18. The electronics package according to claim 1 wherein said hermetic electrically insulating thin film diamond such as ultra-nanocrystalline diamond or ceramics, such as alumina.

* * * * *